United States Patent [19]

Preputnick

[11] Patent Number: 4,887,353

[45] Date of Patent: Dec. 19, 1989

[54] CONDUCTION COOLED MODULE CONNECTOR SYSTEM AND METHOD OF MAKING

[75] Inventor: George Preputnick, Harrisburg, Pa.

[73] Assignee: AMP Incorporated, Harrisburg, Pa.

[21] Appl. No.: 729,432

[22] Filed: May 1, 1985

[51] Int. Cl.[4] ........................ H05K 3/36; H01R 23/70

[52] U.S. Cl. ........................................ 29/830; 439/79; 361/413

[58] Field of Search .......................... 29/830; 174/685; 339/17 R, 17 M, 17 LM, 176 MP; 361/386, 387, 388, 412, 413; 439/79

[56] References Cited

U.S. PATENT DOCUMENTS 3,300,686 1/1967 Johnson et al. .............. 339/17 R X
3,651,444 3/1972 Desso et al. ............ 339/176 MP X
3,660,803 5/1972 Cooney ........................ 339/176 MP
3,675,083 7/1972 White ................................ 361/413
3,912,353 10/1975 Kasuya et al. .......... 339/176 MP X
4,029,374 6/1977 Nestor et al. ............ 339/17 LM X
4,412,712 11/1983 Reimer et al. .................. 339/17 M

*Primary Examiner*—Carl J. Arbes
*Attorney, Agent, or Firm*—Allan B. Osborne

[57] ABSTRACT

A connector system incorporating a heat sink positioned between a pair of circuit cards terminated in a pair of joined receptacle units. A method is disclosed of connecting a daughter card to a receptacle unit, testing that subassembly, and then securing two such subassemblies together with a heat sink between the two cards to form an assembly to be mounted on a pin header mounted on a circuit board.

6 Claims, 4 Drawing Sheets

FIG. 1

CONDUCTION COOLED MODULE CONNECTOR SYSTEM AND METHOD OF MAKING

BACKGROUND OF THE INVENTION

1. Field of the Invention

The invention disclosed herein pertains to card edge connectors and a heat sink to conduct heat away from a pair of parallel circuit cards terminated in separate card edge connectors and which are thereafter joined to form a single connector.

2. Prior Art

Contemporary systems include a heat sink which is mounted between two circuit cards prior to the circuit cards being mounted on card edge connectors. Upon testing the connectors and finding defective contact members, the entire assembly must be carefully disassembled to replace such defective members.

SUMMARY OF THE INVENTION

The present invention discloses a card edge connector system including a conduction type heat sink sandwiched between a pair of circuit cards. More particularly, the invention teaches a method of first mounting daughter cards on receptacle units, testing the electrical integrity therebetween, replacing defective contact elements as required, securing the two units together with a heat sink between the cards and mounting the two secured units onto a pin header mounted on a circuit board.

DESCRIPTION OF THE INVENTION

Figure 1:
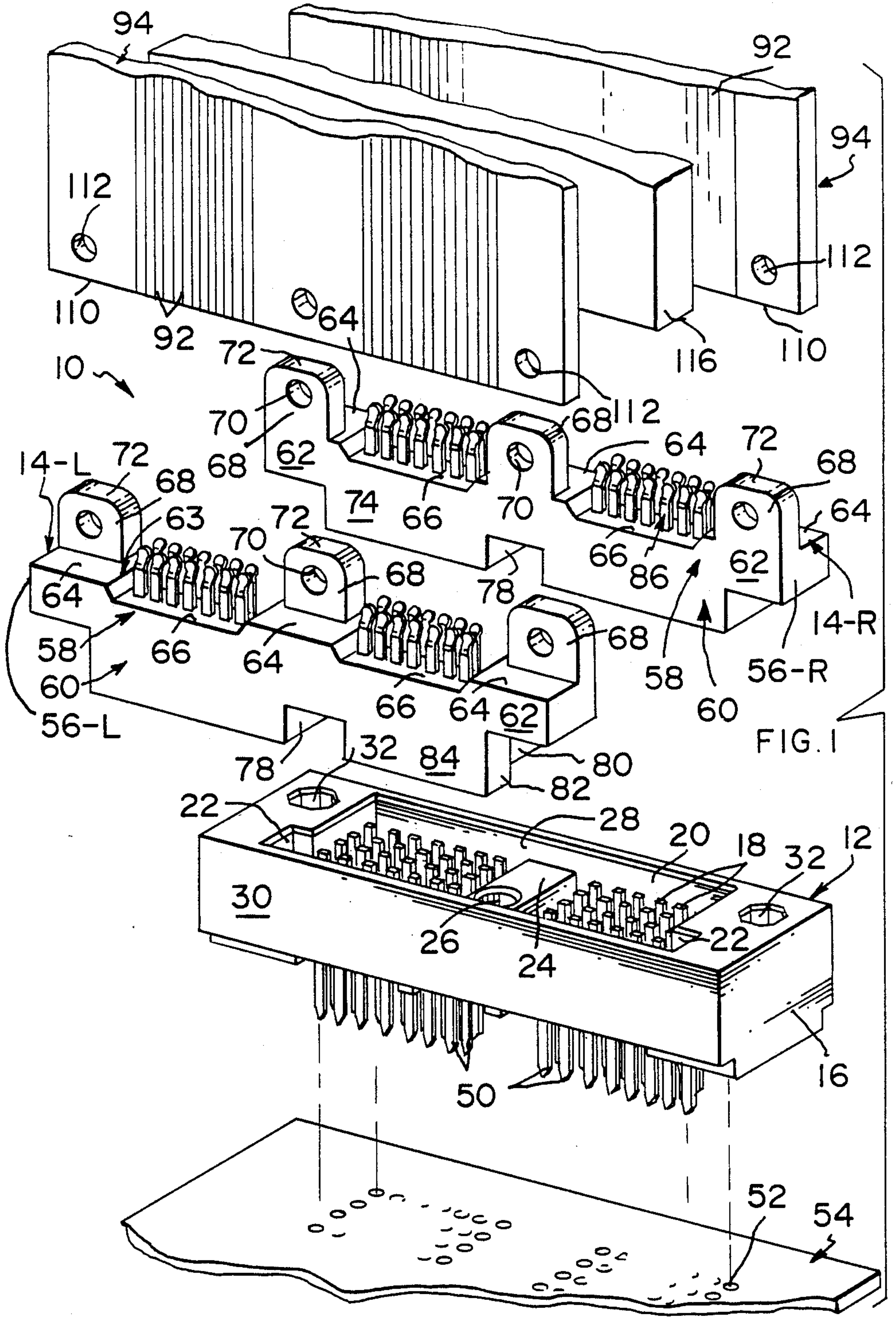
FIG. 1 is a perspective view of the connector system of the present invention prior to being assembled.

The major components of the connector system seen in FIG. 1, are indicated generally by reference numeral 10 and include pin header 12 and two receptacle units 14.

Pin header 12 includes an insulating housing 16 and contact pins 18. The housing is preferably molded from a polyphenylene sulfide resin sold under the trade name RYTON by the Phillips Chemical Company. An upwardly open cavity 20 is provided in the housing. Polarizing slots 22 are located in opposing end walls of the cavity 20. A transverse wall 24 is located in and midway between the ends of the cavity 20 and includes a keying opening 26. This wall 24 is attached to and extends between side walls 28 and 30. The surface of this transverse wall 24 is below the top surface of the housing. Two openings, indicated by reference numeral 32, are provided in housing 16, one on each side of cavity 20 and are adjacent side wall 28.

Figure 2:
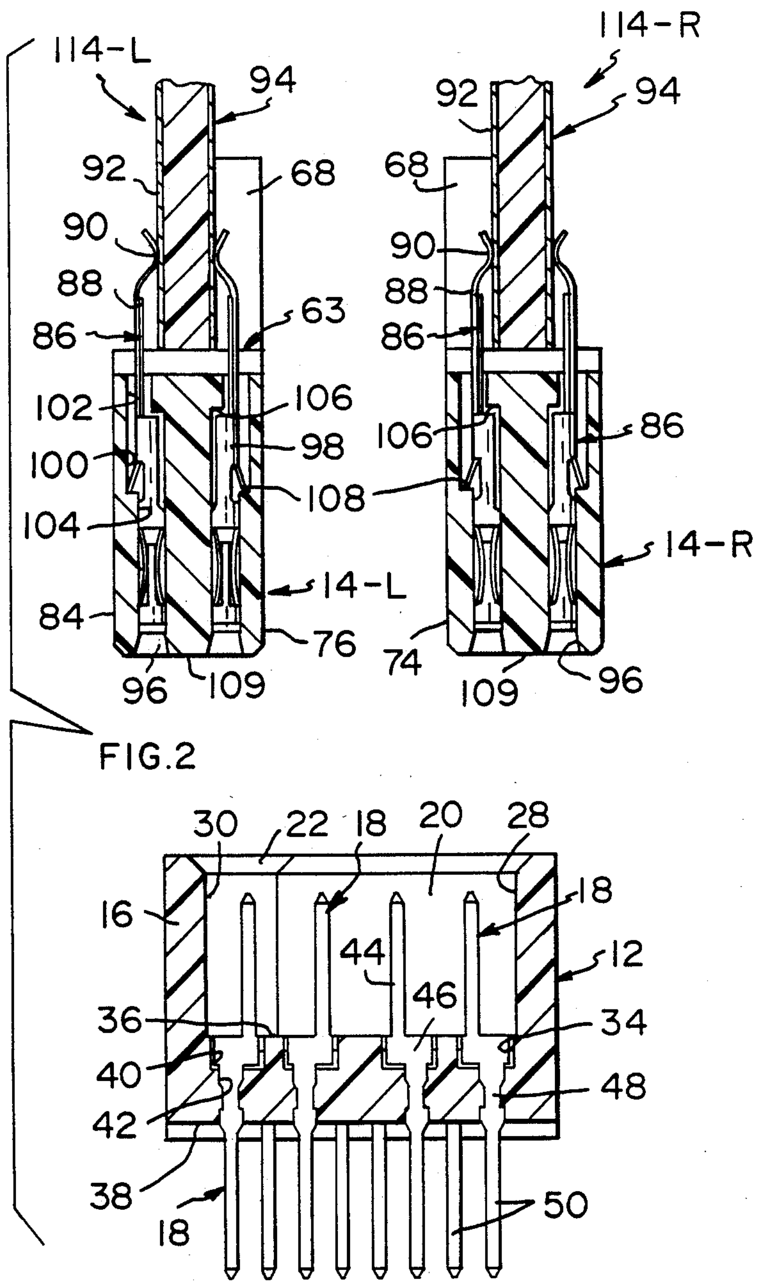
FIG. 2 is a cross-sectional end view showing the first stage of assembling the connector system.

A transverse cross sectional view of pin header 12 is provided in FIG. 2. There it can be seen that rows of contact pin receiving passages 34 extend from the floor 36 of cavity 20 down through housing 16 opening out on the downwardly facing surface 38. Each passage 34 includes large section 40 opening out at floor 36 and a small section 42, in communication with large section 40, extending downwardly therefrom and opening out at downwardly facing surface 38. Sections 40, 42 meet on one or the other side of a center-line (not shown) thru sections 40 in a predetermined pattern dictated by the density of contact pins 18 and holes 52 on circuit board 54. As shown in the transverse row of passages 34 in FIG. 2, the two small sections 42 on the right hand side of pin header 12 are to the right of center and the two small sections 42 on the left hand side are to the left of center. Not shown but discernible from leads 50 on the contact pins 18 in the transverse row behind the row shown, the reverse pattern holds; i.e., the two small sections 42 on the right hand side of pin header 12 are to the left of center and the two small sections 42 on the left hand side are to the right of center. The pattern of the two transverse rows described above repeats from one end of pin header 12 to the other end.

With regard to contact pins 18, FIG. 2 shows the general structure. Each pin 18 includes a square post 44 which extends up into cavity 20, an intermediate section 46 positioned in large section 40, a retaining section 48 positioned in small section 42 and a depending lead 50. These leads 50 are soldered into holes 52 in mother board 54 (FIG. 1). However, they could be of other configurations; e.g., a frictional fit utilizing a compliant section.

Figure 4:
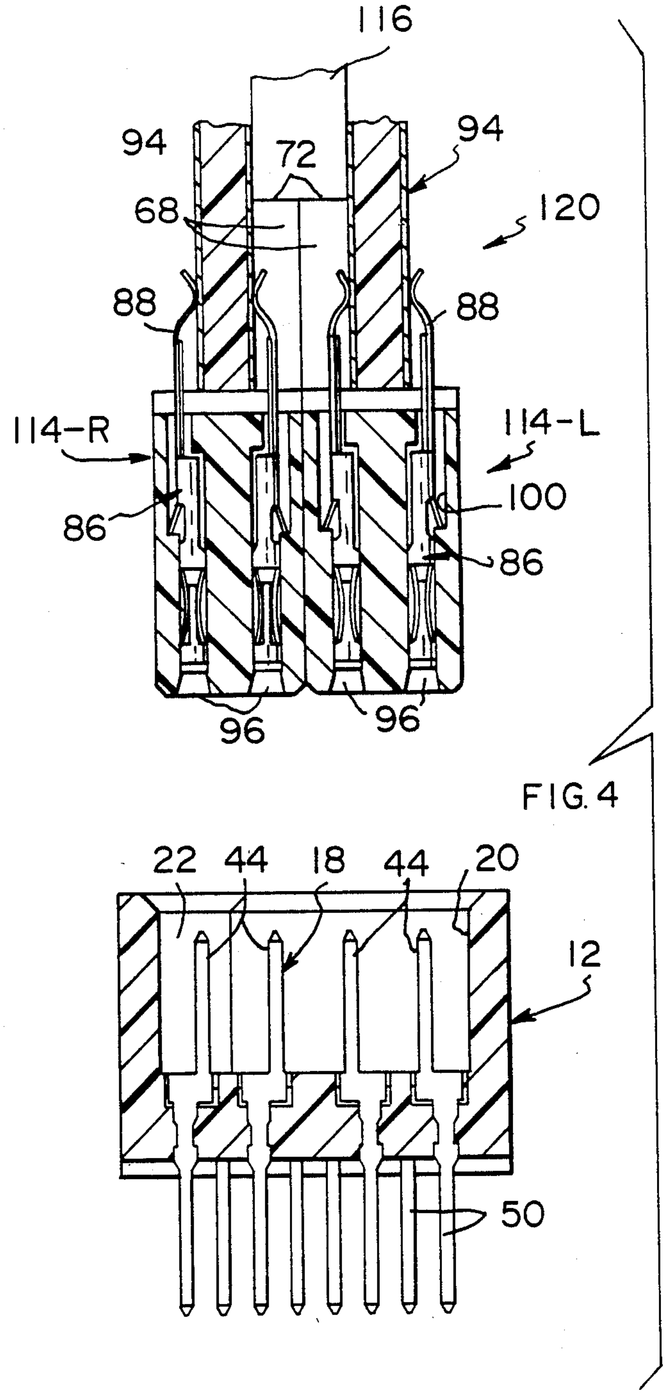
FIG. 4 is a cross-sectional end view of the assembled connector system.

Receptacle units 14 are shown isometrically in FIG. 1 and sectioned in FIGS. 2 and 4. While the two units 14 have common structure, there are differences: accordingly, the units 14 are distinguished by adding reference letters "L" for the left hand unit 14 and "R" for the right hand unit 14.

Both units 14 include housing 56 (also distinguished by the letters "L" and "R"). The housing 56, preferably molded from polyphenylene sulfide resin, are formed to provide a longitudinally elongated upper half or portion 58 and a lower portion 60 of lesser length. The differing lengths define overhanging end portions 62. The length and depth of the lower portions 60 is equal to the length and depth of cavity 20 in pin header 12. Preferably, the length of the upper sections 58 is equal to the length of pin header 12.

The upwardly facing surface 63 on housings 56 include three, spaced apart areas 64 and two intervening, downwardly displaced areas 66. Each of the three areas 64 support an upwardly projecting ear 68. Holes 70 are provided in each ear 68 and the upwardly facing surface 72 thereof is flat. The ears 68 on housing 56-R are on that housing's inward side 74. The ears 68 on housing 56-L are on that housings's inward side 76. The inward sides 74 and 76 are seen more clearly in FIG. 2. These sides 74,76 abut when the units 14 are secured together as shown in FIG. 4.

As seen in FIG. 1, a downwardly opened, transverse notch 78 is provided in each lower portion 60 midway between the two ends. Further, on housing 56-L, the end walls 80 of lower portion 60 are recessed or stepped to define a short wall segment 82 on the outward side 84. The size of these segments 82 are such as to fit into slots 22 in pin header 12.

Not shown are depending studs on the lower surfaces of overhanging end portions 62 on unit 14-R and in notch 78 of unit 14-L. These studs are located so as to enter openings 32 and 26 respectively.

Each receptacle unit 14 is loaded with two rows of spaced apart, contact elements 86 shown in FIGS. 2 and 4. Elements 86 include a cantilever spring arm 88 at the upper end with a convex surface 90 for being soldered to conductive traces 92 on dauaghter card 94. A box style receptacle 96 is provided on the lower end of element 86 and retention section 98 is positioned between receptacle 96 and arm 88.

Contact-receiving passageway 100 in units 14 which receive elements 86 include an upper section 102 and a lower section 104 which is offset horizontally in relation to upper section 102. The offset is towards the longitudinal center line of units 14 and provides downwardly facing shoulder 106 and upwardly facing shoulder 108. These shoulders 106,108, in cooperation with the structure of element 86, retain element 86 in the contact-receiving passageway 100.

Contact-receiving passageway 100 open out on both upper surface 63 and lower surface 109 of units 14.

The two rows of elements 86 are positioned in each unit 14 so that convex surfaces 90 face each other as shown.

The system of the present invention is assembled by first loading contact pins 18 into pin header 12 and receptacle elements 86 into units 14. The header 12 and units 14 at this stage are as shown in FIG. 1. Pin header 12 is mounted onto printed circuit board 54 by inserting and soldering leads 50 into holes 52. Next, daughter cards 94 are positioned on units 14 so that the ends and middle sections of lower edges 110 (FIG. 1) rest on flat, spaced apart areas 64 on upwardly facing surfaces 63 and holes 112 in cards 94 are in alignment with holes 70 in ears 68. Concurrently, the sections of the edges 110 having traces 92 are inserted between the two rows of cantilever arms 88 on elements 86 with the convex surfaces 90 bearing against respective traces 92. Convex surfaces 90 are next soldered to traces 92 to form the subassembly (Unit 14 plus card 94), indicated generally by reference numeral 114 in FIG. 2. The subassemblies 114 are then tested to insure electrical integrity. In the event a failure is present, it is a simple matter to replace defective elements 86 or cards 94.

Figure 3:
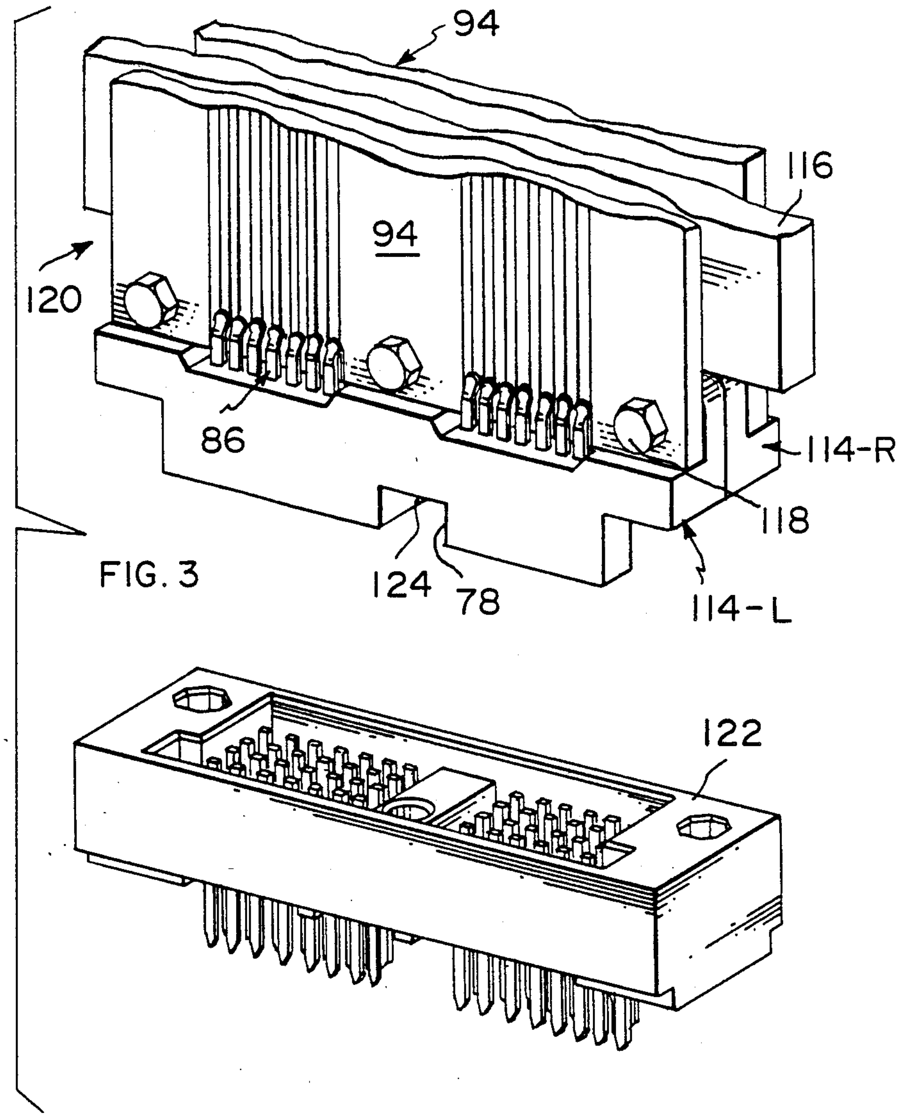
FIG. 3 is a perspective view of the assembled connector system.

After testing and any required repairing, the two subassemblies 114L, 114R are bolted together with heat sink 116 therebetween as shown in FIGS. 3 and 4. Bolts 118 (FIGS. 3) pass through holes 112 in the cards 94 and holes 70 in ears 68. Heat sink 116 rests on flat surfaces 72 of ears 68 as shown in FIG. 4 and is held in place between the bolted together cards 94. The surface area of cards 94 which abut heat sink 116 is devoid of traces 92; such traces being diverted to opposing surfaces by means of vias (not shown) located near card edges 110. As is well known in the art, this arrangement permits a higher concentration of electronic packages (not shown) on such opposing surfaces. The two bolted together subassemblies 114L, 114R form module assembly 120 as shown in FIGS. 3 and 4.

Module assembly 120 is now ready for placing into pin header 12 to complete the system assembly. The short wall segments 82 on each end of unit 14-L and slots 22 in pin header 12 provides proper orientation so that assembly 120 cannot be incorrectly inserted. As the lower portions 60 enter cavity 20 in pin header 12, posts 44 on contact pins 18 enter receptacles 96 on elements 86 in units 14-L, 14-R to electrically interconnect traces 92 on cards 94 with plated-through holes 52 in board 54 and hence to traces (not shown) on the board 54. The overhanging end portions 62 rest on upper surface 122, FIG. 3. Similarly, the upper walls 124 defining notches 78 rest on transverse wall 24. The aforementioned studs (not shown) entering openings 32 and 26 as noted above. In the alternative, bolts can be mounted in units 14-L, 14-R and openings 32 and 26 provided with threads to receive the bolts.

The heat sink 116 are user designed. Materials commonly used to make such sinks include aluminum, copper and copper-invar-copper.

I claim:

1. A method of forming connector assemblies and connecting them to a printed circuit board, comprising the steps of:

a. electrically connecting electrical contacts of first and second electrical connectors to respective conductive traces on first and second daughter cards thereby forming subassemblies;
b. testing the subassemblies to determine if electrical contacts or daughter cards should be replaced;
c. securing the first and second connectors together with a heat sink member disposed between the daughter cards; and
d. electrically connecting the first and second electrical connectors with a third electrical connector electrically connected to the printed circuit board.

2. The method of claim 1 further including the step of orientating the first and second electrical connectors relative to the third electrical connector with respect to cooperating polarizing means on the three electrical connectors.

3. An electrical connection assembly connecting daughter cards to a printed circuit board, comprising:

a. first and second electrical connectors having electrical contact members secured therein, said electrical contact members having first contact sections electrically connected to conductive traces on the daughter cards and second contact sections;
b. securing means provided by said first and second electrical connectors and the daughter cards securing said first and second electrical connectors and the daughter cards together, said securing means on said first and second electrical connectors engaging each other thereby spacing the daughter cards from each other and providing a space therebetween;
c. heat sink means disposed in said space between the daughter cards and secured therein by said securing means; and
d. a third connector electrically connected to the printed circuit board and having electrical contact means that electrically connect with the second contact sections of said first and second electrical connectors when they mate with said third connector.

4. The electrical connection assembly of claim 3 wherein the first and second electrical connectors include rear surfaces adapted for conformably engaging each other when said first and second electrical connectors are secured together.

5. The electrical connection assembly of claim 3 further including cooperating polarizing means on one of said first and second electrical connectors and on said third electrical connector.

6. The electrical connection assembly of claim 3 wherein the securing means include upwardly extending ears on each of the first and second electrical connectors with said ears having top surfaces forming a support for the heat sink.

* * * * *